(12) United States Patent
Chen et al.

(10) Patent No.: US 10,727,866 B2
(45) Date of Patent: Jul. 28, 2020

(54) KEYBOARD APPARATUS

(71) Applicant: Lite-On Technology Corporation, Taipei (TW)

(72) Inventors: Er-Hao Chen, Taipei (TW); Wen-Tong Liu, Taipei (TW)

(73) Assignee: Lite-On Technology Corporation, Taipei (TW)

(*) Notice: Subject to any disclaimer, the term of this patent is extended or adjusted under 35 U.S.C. 154(b) by 59 days.

(21) Appl. No.: 15/954,613

(22) Filed: Apr. 17, 2018

(65) Prior Publication Data

US 2019/0052285 A1  Feb. 14, 2019

Related U.S. Application Data

(60) Provisional application No. 62/543,389, filed on Aug. 10, 2017.

(51) Int. Cl.
  *H03M 11/00* (2006.01)
  *G06F 3/023* (2006.01)

(52) U.S. Cl.
  CPC .......... *H03M 11/003* (2013.01); *G06F 3/023* (2013.01)

(58) Field of Classification Search
  CPC ............................. H03M 11/003; G06F 3/023
  USPC ........................................................... 341/24
  See application file for complete search history.

(56) References Cited

U.S. PATENT DOCUMENTS

| 5,448,236 A | 9/1995 | Shiga | |
| 8,314,723 B2 | 11/2012 | Huang et al. | |
| 8,754,790 B2 | 6/2014 | Lin | |
| 9,698,777 B1 | 7/2017 | Alon | |
| 2009/0096640 A1* | 4/2009 | Sherman | H03M 11/003 341/24 |
| 2010/0066572 A1* | 3/2010 | Dietz | H01H 13/702 341/34 |
| 2010/0253554 A1* | 10/2010 | Huang | H03M 11/003 341/26 |
| 2011/0078476 A1* | 3/2011 | Han | G06F 1/32 713/320 |
| 2017/0147086 A1 | 5/2017 | Lee et al. | |
| 2019/0196604 A1* | 6/2019 | Chen | G06F 3/023 |

FOREIGN PATENT DOCUMENTS

| TW | 201037978 | 10/2010 |
| TW | 201248453 | 12/2012 |
| TW | I485991 | 5/2015 |

OTHER PUBLICATIONS

"Office Action of Taiwan Counterpart Application", dated Nov. 27, 2018, p. 1-p. 5.

(Continued)

*Primary Examiner* — Albert K Wong
(74) *Attorney, Agent, or Firm* — JCIPRNET

(57) ABSTRACT

A keyboard apparatus including a key module and a detection circuit is provided. The key module includes a plurality of keys, a plurality of scan lines, and a plurality of return lines. The scan lines and the return lines are crossed to each other and coupled to the keys respectively. The detection circuit is coupled to the return lines and configured to detect a current flowing through each of the return lines and indicate that a switch of each of the keys is in an on state or in an off state according to a value of the current.

5 Claims, 10 Drawing Sheets

(56) References Cited

OTHER PUBLICATIONS

"Office Action of Taiwan Counterpart Application", dated Jun. 5, 2018, p. 1-p. 7.
"Office Action of Taiwan Counterpart Application,", dated Jul. 30, 2019, p. 1-p. 6.

* cited by examiner

KEYBOARD APPARATUS

CROSS REFERENCE TO RELATED APPLICATION

This application claims the priority benefit of U.S. provisional application Ser. No. 62/543,389, filed on Aug. 10, 2017. The entirety of the above-mentioned patent application is hereby incorporated by reference herein and made a part of specification.

BACKGROUND OF THE DISCLOSURE

Field of the Disclosure

The disclosure relates to a keyboard apparatus, and particularly relates to a keyboard apparatus which can avoid a ghost key phenomenon and have a low manufacturing cost.

Description of Related Art

In order to avoid using excessive wiring, which causes increasing a manufacturing cost of a keyboard itself and an inconvenience of the actual assembly, conventional keyboard apparatuses are mostly designed with a key matrix. For the keyboard apparatus designed with the key matrix, it is prone to a ghost key phenomenon based on a physical characteristic of the key matrix itself. The main cause of the occurrence of the ghost key is described in detail in Taiwan Patent Publication No 1485991. To avoid the ghost key phenomenon, general solution is to increase the size of the key matrix, or to separate each key with a diode, for example. However, such practices will also significantly increase the manufacturing cost of the keyboard apparatus.

SUMMARY OF THE DISCLOSURE

In view of the above, the disclosure provides a keyboard apparatus, which not only can avoid the ghost key phenomenon, but also have an advantage of low manufacturing cost.

The disclosure provides a keyboard apparatus including a key module and a detection circuit. The key module includes a plurality of keys, a plurality of scan lines, and a plurality of return lines. The scan lines and the return lines are crossed to each other and respectively coupled to the keys. The detection circuit is coupled to the return lines and configured to detect a current flowing through each of the return lines and indicate that a switch of each of the keys is in an on state or in an off state according to a value of the current.

In an embodiment of the disclosure, the detection circuit includes a selection circuit and a current-to-voltage converter. The selection circuit is coupled to the return lines. The current-to-voltage converter is coupled between the selection circuit and a first voltage terminal. The selection circuit is controlled by a plurality of selection signals to conduct a current path between the current-to-voltage converter and a selected return line of the return lines, so that the current-to-voltage converter detects the current of the selected return line to serve as a detection current. The current-to-voltage converter converts the detection current into a detection voltage, and accordingly indicates that a switch of each of the keys coupled to the selected return line is in an on state or in an off state.

In an embodiment of the disclosure, the detection circuit includes a plurality of current-to-voltage converters. Each of the current-to-voltage converters is coupled between corresponding one of the return lines and the first voltage terminal and configured to detect the current of the corresponding return line to serve as a detection current and convert the detection current into a detection voltage to indicate that a switch of each of the keys of the corresponding return line is in an on state or at in off state.

Based on the above, in the keyboard apparatus provided by the embodiments of the disclosure, the detection circuit can detect the current flowing through each of the return lines of the key module and correctly indicate that the switch of each of the keys of the key module is in an on state or in an off state according to the value of the detected current of each of the return lines. Hence, the ghost key phenomenon can be avoided. In addition, the detection circuit of the embodiments of the disclosure applies the current-to-voltage converter to detect the value of the current of each of the return lines, so as to determine whether each of the keys is pressed or not. Thus, in comparison to the general solutions to the ghost key phenomenon, such as increasing the size of the key matrix or separating each key with the diode, the detection circuit provided by the embodiments of the disclosure can effectively reduce the manufacturing cost of the keyboard apparatus.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
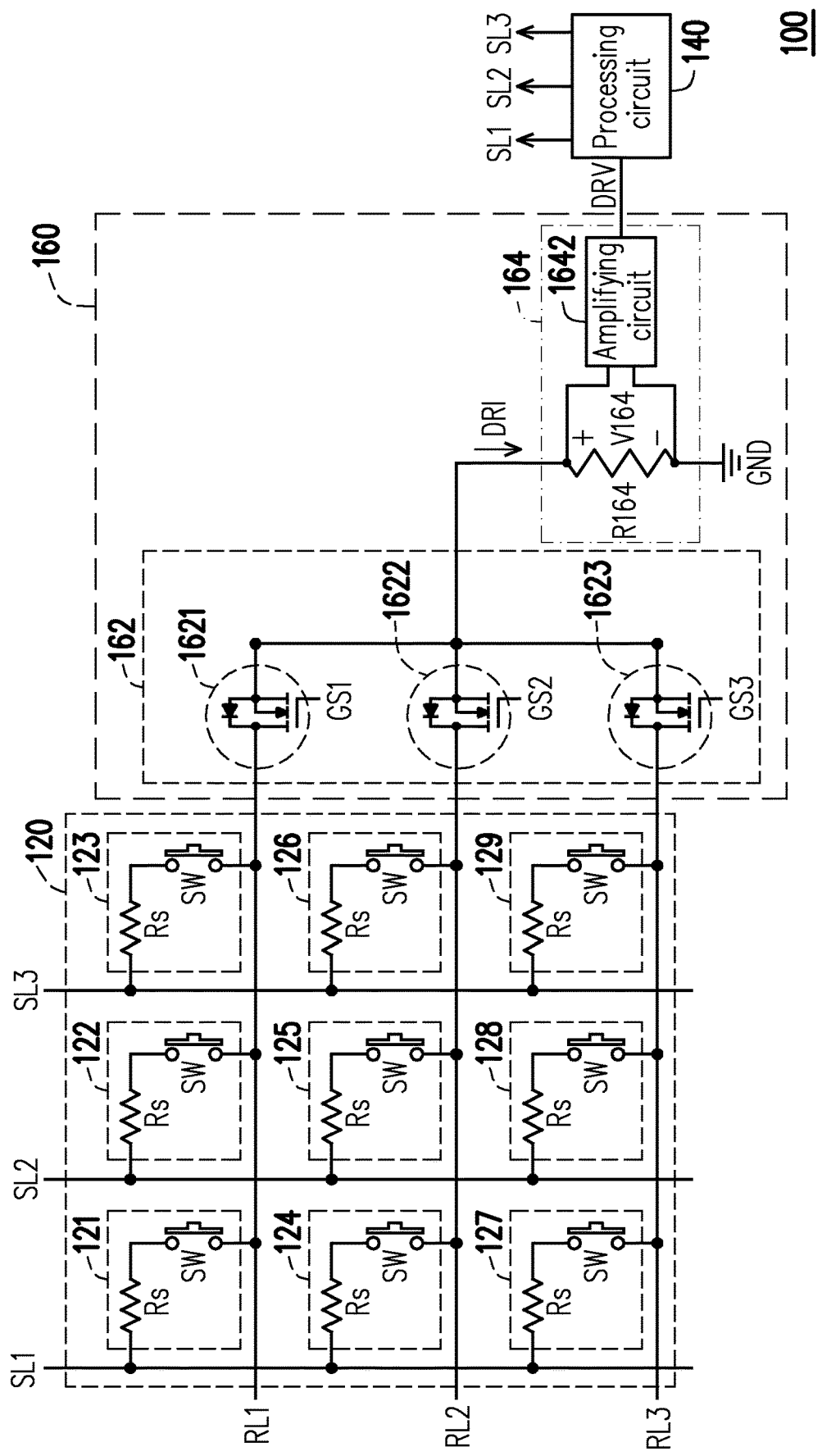
FIG. 1 is a schematic diagram illustrating a keyboard apparatus according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

Referring to FIG. 1, FIG. 1 is a schematic diagram illustrating a keyboard apparatus 100 according to an embodiment of the disclosure. The keyboard apparatus 100 may include a key module 120, a detection circuit 160, and a processing circuit 140, but the disclosure is not limited thereto. The key module 120 may include (M multiplied by N) keys, N scan lines, and M return lines, wherein M may be a positive integer greater than or equal to 2, and N may also be a positive integer greater than or equal to 2. For convenience of explanation, it is assumed that both M and N are 3 in the embodiment, and exemplary embodiments that M and N are other numerical values may be inferred from the following descriptions. Thus, the key module 120 shown in FIG. 1 shows 9 keys 121-129, three scan lines SL1-SL3, and three return lines RL1-RL3. The scan lines SL1-SL3 and the return lines RL1-RL3 are crossed to each other and respectively coupled to the keys 121-129 to form a chessboard structure as shown in FIG. 1.

In an embodiment of the disclosure, the keyboard apparatus 100 may be a membrane keyboard apparatus, and the keys 121-129 may be membrane keys, but the disclosure is not limited thereto.

First terminals of the key 121, the key 124, and the key 127 are coupled to the scan line SL1. Second terminals of the key 121, the key 124, and the key 127 are respectively coupled to the return line RL1, the return line RL2, and the return line RL3. First terminals of the key 122, the key 125, and the key 128 are coupled to the scan line SL2. Second terminals of the key 122, the key 125, and the key 128 are respectively coupled to the return line RL1, the return line RL2, and the return line RL3. Additionally, first terminals of the key 123, the key 126, and the key 129 are coupled to the scan line SL3. Second terminals of the key 123, the key 126, and the key 129 are respectively coupled to the return line RL1, the return line RL2, and the return line RL3.

In the embodiment shown in FIG. 1, each of the keys 121-129 may include a resistor Rs and a switch SW, wherein the resistor Rs is connected in series with the switch SW. The switch SW in each of the keys (e.g., the key 121) may be turned on in response to the key (the key 121) which is pressed, and the switch SW in each of the keys (e.g., the key 121) may not be turned on in response to the key (the key 121) which is not pressed.

The processing circuit 140 is coupled to the scan lines SL1-SL3. The processing circuit 140 is configured to sequentially activate one of the scan lines SL1-SL3. The detection circuit 160 is coupled to the return lines RL1-RL3 and the processing circuit 140. The detection circuit 160 is configured to detect a current of each of the return lines RL1-RL3 and indicate that the switch SW of each of the keys 121-129 is in an on state or in an off state according to a value of the detected current of each of the return lines RL1-RL3.

Furthermore, in the embodiment shown in FIG. 1, the detection circuit 160 may include a selection circuit 162 and a current-to-voltage converter 164. The selection circuit 162 is coupled to the return lines RL1-RL3. The current-to-voltage converter 164 is coupled between the selection circuit 162 and a first voltage terminal, wherein the first voltage terminal may be a ground voltage terminal GND, for example, but the disclosure is not limited thereto. The selection circuit 162 may be controlled by selection signals GS1-GS3, which are generated by the processing circuit 140, so as to choose one of the return lines RL1-RL3 to be a selected return line (e.g., the return line RL1) and conduct a current path between the current-to-voltage converter 164 and the selected return line (the return line RL1), such that the current-to-voltage converter 164 detects the current flowing through the selected return line (the return line RL1) to serve as a detection current DRI. Additionally, the current-to-voltage converter 164 may convert the detection current DRI into a detection voltage DRV and accordingly indicate that the switch SW of each of the keys coupled to the selected return line (the return line RL1) is in an on state or in an off state.

In an embodiment of the disclosure, the selection circuit 162 may include return switches 1621-1623, wherein the return switches 1621-1623 may be implemented by using N-type metal oxide semiconductor field effect transistors (NMOS FET), but the disclosure is not limited thereto. A first terminal of the return switch 1621 is coupled to the return line RL1, a second terminal of the return switch 1621 is coupled to the current-to-voltage converter 164, and a control terminal of the return switch 1621 receives the selection signal GS1. A first terminal of the return switch 1622 is coupled to the return line RL2, a second terminal of the return switch 1622 is coupled to the current-to-voltage converter 164, and a control terminal of the return switch 1622 receives the selection signal GS2. A first terminal of the return switch 1623 is coupled to the return line RL3, a second terminal of the return switch 1623 is coupled to the current-to-voltage converter 164, and a control terminal of the return switch 1623 receives the selection signal GS3. In other embodiments of the disclosure, the selection circuit 162 may also be implemented by using a multiplexer or a de-multiplexer.

In an embodiment of the disclosure, the current-to-voltage converter 164 may include a resistor R164 and an amplifying circuit 1642. The resistor R164 is coupled between the second terminal of each of the return switches 1621-1623 and the ground voltage terminal GND, and may generate a voltage difference V164 between two terminals of the resistor R164 in response to the detection current DRI. Particularly, a resistance value of the resistor R164 is much smaller than a resistance value of the resistor Rs in each of the keys 121~129. The amplifying circuit 1642 is coupled to the two terminals of the resistor R164 to receive the voltage difference V164, and amplifies the voltage difference V164 to generate the detection voltage DRV.

In an embodiment of the disclosure, the processing circuit 140 may be hardware, firmware, software stored in a memory to be loaded and executed by a micro-processor or a digital signal processor, or a machine-executable code. If the processing circuit 140 is implemented by using hardware, the processing circuit 140 may be realized by a single integrated circuit chip or a plurality of circuit chips, but the disclosure is not limited thereto. The plurality of circuit chips or the single integrated circuit chip may be implemented by using an application-specific integrated circuit (ASIC) or a field-programmable gate array (FPGA). The aforementioned memory may be a random access memory, a read-only memory, or a flash memory, for example.

The operations of the keyboard apparatus 100 will be described below. For convenience of explanation, in the following embodiments, it is assumed that a logical high level is 5V, a logical low level (e.g., an electric potential of the ground voltage terminal GND) is 0V, a resistance value of the resistor Rs of each of the keys 121-129 is 4.7 kilo-ohms (Ku), a resistance value of the resistor R164 is 33 ohms (a), and an amplification of the amplifying circuit 1642 is 150 times, but the disclosure is not limited thereto.

When the processing circuit 140 generates the selection signals GS1-GS3 to turn on the return switch 1621 and turn off the return switch 1622 and the return switch 1623, the detection circuit 160 may detect the current flowing through the return line RL1 to serve as the detection current DRI and accordingly indicate that the switch SW of each of the keys 121-123 coupled to the return line RL1 is in an on state or in an off state.

For instance, when the scan line SL1 is activated, the voltage applied to the scan line SL1 is a logical high level (e.g., 5V), and the voltage applied to the scan line SL2 and the scan line SL3 is a logical low level (e.g., 0V) or a high impedance electric potential. Therefore, if the key 121 is pressed such that the switch SW of the key 121 is turned on, the scan line SL1, the resistor Rs and the switch SW of the key 121, the return line RL1, the return switch 1621, the resistor R164, and the ground voltage terminal GND will form a closed loop to generate a current. At this time, the current (i.e., the detection current DRI) of the return line RL1 is about 1 mA (i.e., 5V÷(4.7+0.033)KΩ≈1 mA), and the detection voltage DRV generated by the current-to-voltage converter 164 is about 4.95V (i.e., 150×0.033KΩ×1 mA=4.95V). On the other hand, if the key 121 is not pressed such that the switch SW of the key 121 is not turned on, the detection current DRI is 0 mA, and the detection voltage DRV generated by the current-to-voltage converter 164 is 0V. Thus, when the scan line SL1 is activated, the detection circuit 160 may indicate that the switch of the key 121 is in an on state or in an off state according to the value of the detection current DRI, and the processing circuit 140 may determine whether the key 121 is pressed or not according to the detection voltage DRV converted by the detection circuit 160. For instance, if the detection voltage DRV is larger than a first reference voltage, the processing circuit 140 may determine that the key 121 is pressed. On the other hand, if the detection voltage DRV is smaller than a second reference voltage, the processing circuit 140 may determine that the key 121 is not pressed, wherein the second reference voltage is smaller than or equal to the first reference voltage.

Likewise, when the scan line SL2 is activated, the voltage applied to the scan line SL2 is a logical high level (e.g., 5V), and the voltage applied to the scan line SL1 and the scan line SL3 is a logical low level (e.g., 0V) or a high impedance electric potential. Therefore, if the key 122 is pressed such that the switch SW of the key 122 is turned on, the scan line SL2, the resistor Rs and the switch SW of the key 122, the return line RL1, the return switch 1621, the resistor R164, and the ground voltage terminal GND will form a closed loop to generate a current. At this time, the current (i.e., the detection current DRI) of the return line RL1 is about 1 mA (i.e., 5V÷(4.7+0.033)KΩ≈1 mA), and the detection voltage DRV generated by the current-to-voltage converter 164 is about 4.95V (i.e., 150×0.033KΩ×1 mA=4.95V). On the other hand, if the key 122 is not pressed such that the switch SW of the key 122 is not turned on, the detection current DRI is 0 mA, and the detection voltage DRV generated by the current-to-voltage converter 164 is 0V. Thus, when the scan line SL2 is activated, the detection circuit 160 may indicate that the switch SW of the key 122 is in an on state or in an off state according to the value of the detection current DRI, and the processing circuit 140 may determine whether the key 122 is pressed according to the detection voltage DRV converted by the detection circuit 160.

Likewise, when the scan line SL3 is activated, the voltage applied to the scan line SL3 is a logical high level (e.g., 5V), and the voltage applied to the scan line SL1 and the scan line SL2 is a logical low level (e.g., 0V) or a high impedance electric potential. Therefore, if the key 123 is pressed such that the switch SW of the key 123 is turned on, the scan line SL3, the resistor Rs and the switch SW of the key 123, the return line RL1, the return switch 1621, the resistor R164, and the ground voltage terminal GND will form a closed loop to generate a current. At this time, the current (i.e., the detection current DRI) of the return line RL1 is about 1 mA (i.e., 5V÷(4.7+0.033)KΩ=1 mA), and the detection voltage DRV generated by the current-to-voltage converter 164 is about 4.95V (i.e., 150×0.033KΩ×1 mA=4.95V). On the other hand, if the key 123 is not pressed such that the switch SW of the key 123 is not turned on, the detection current DRI is 0 mA, and the detection voltage DRV generated by the current-to-voltage converter 164 is 0V. Thus, when the scan line SL3 is activated, the detection circuit 160 may indicate that the switch SW of the key 123 is in an on state or in an off state according to the value of the detection current DRI, and the processing circuit 140 may determine whether the key 123 is pressed according to the detection voltage DRV converted by the detection circuit 160.

On the other hand, when the processing circuit 140 generates the selection signals GS1-GS3 to turn on the return switch 1622 and turn off the return switch 1621 and the return switch 1623, the detection circuit 160 may detect the current flowing through the return line RL2 to serve as the detection current DRI and accordingly indicate that the switch SW of each of the keys 124-126 coupled to the return line RL2 is in an on state or in an off state, and the processing circuit 140 may determine whether each of the keys 124-126 is pressed according to the detection voltage DRV converted by the detection circuit 160. The operation details may be inferred from the related descriptions above, and thus are not repeated.

Likewise, when the processing circuit 140 generates the selection signals GS1-GS3 to turn on the return switch 1623 and turn off the return switch 1621 and the return switch 1622, the detection circuit 160 may detect the current flowing through the return line RL3 to serve as the detection current DRI and accordingly indicate that the switch SW of each of the keys 127-129 coupled to the return line RL3 is in an on state or in an off state, and the processing circuit 140 may determine whether each of the keys 127-129 is pressed according to the detection voltage DRV converted by the detection circuit 160. The operation details may be inferred from the related descriptions above, and thus are not repeated.

Figure 2A:
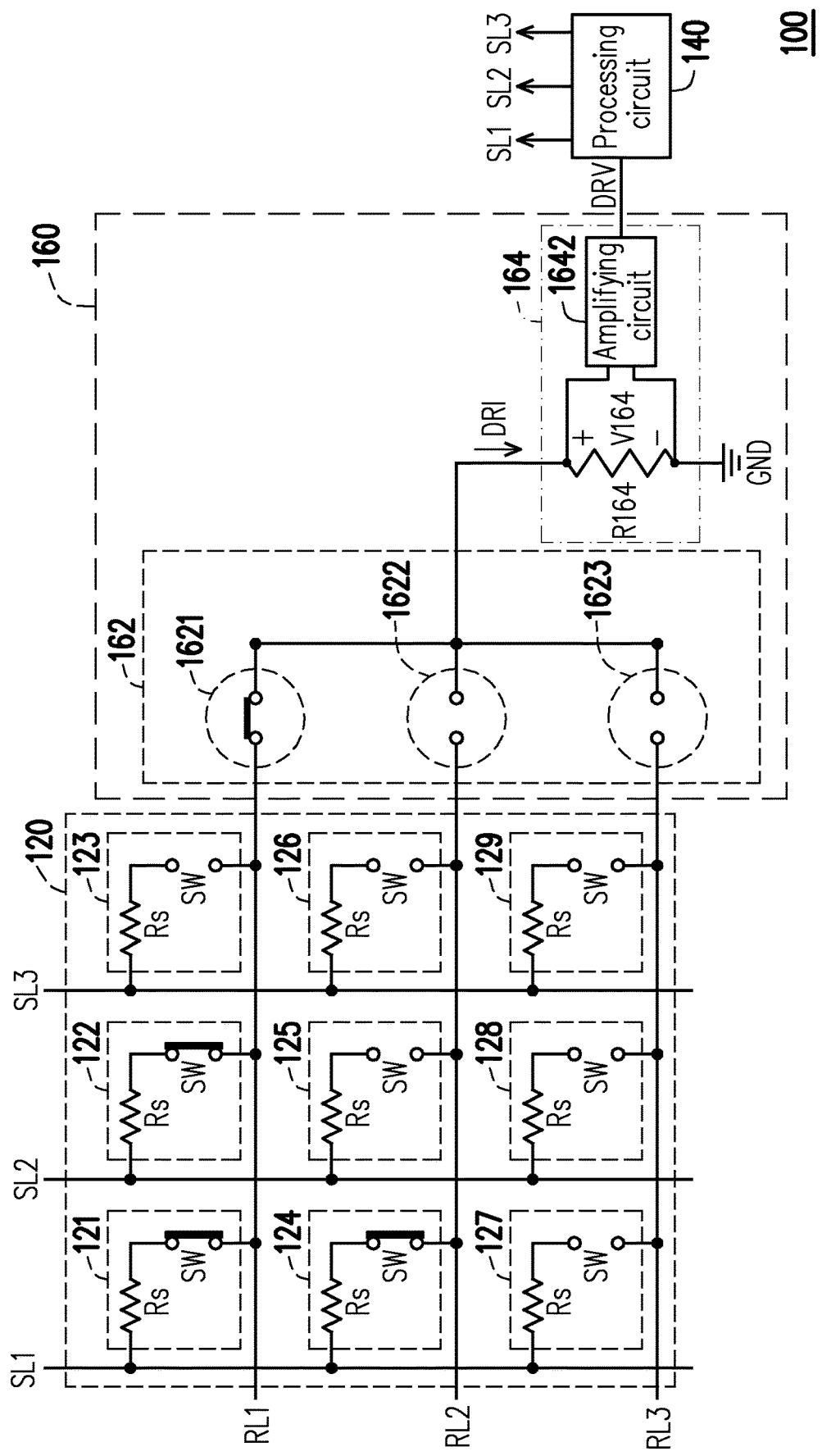
FIG. 2A is a schematic diagram of an equivalent circuit of the keyboard apparatus of FIG. 1 in a specific case.
Figure 2B:
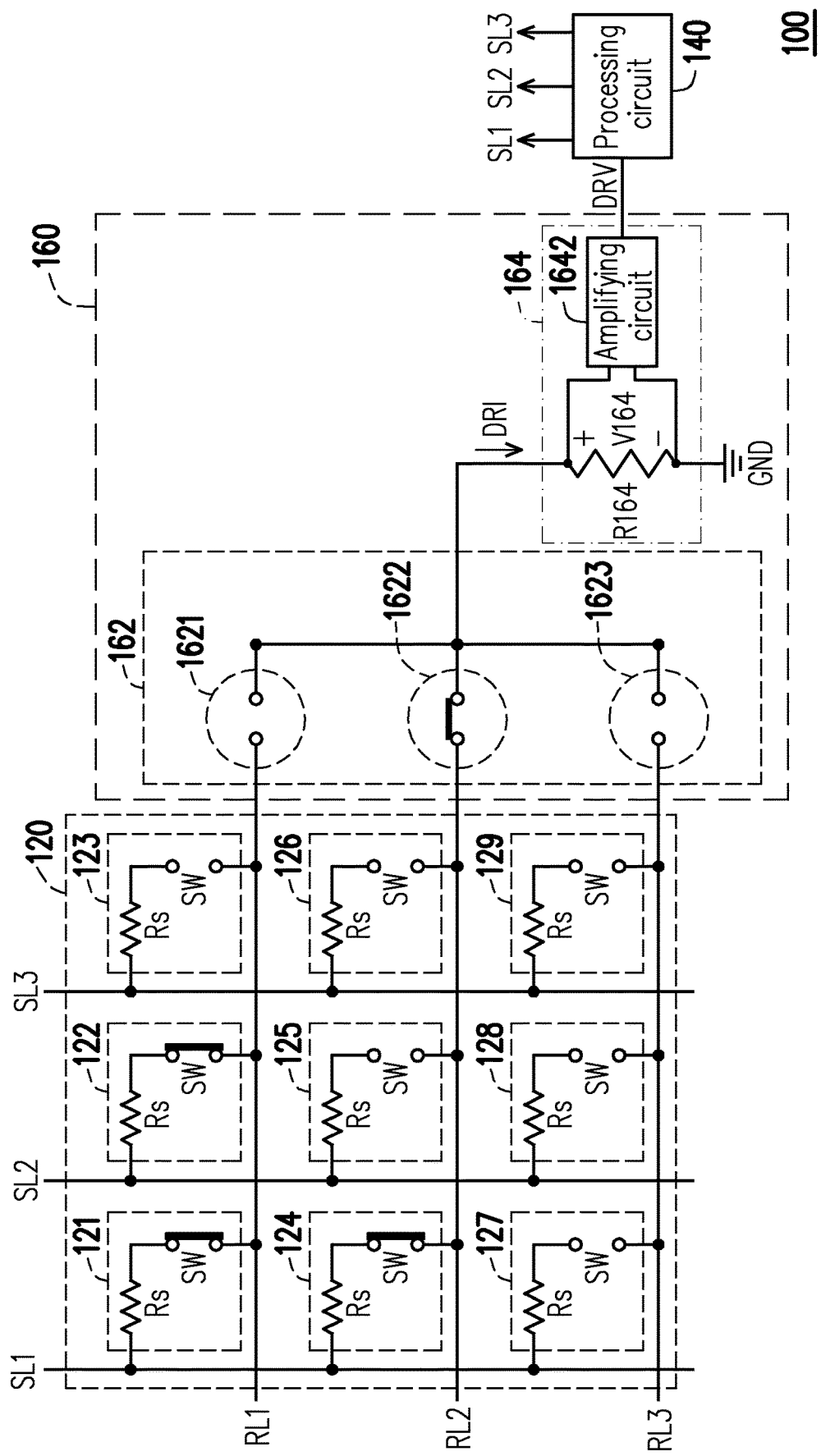
FIG. 2B is a schematic diagram of an equivalent circuit of the keyboard apparatus of FIG. 1 in another specific case.
Figure 2C:
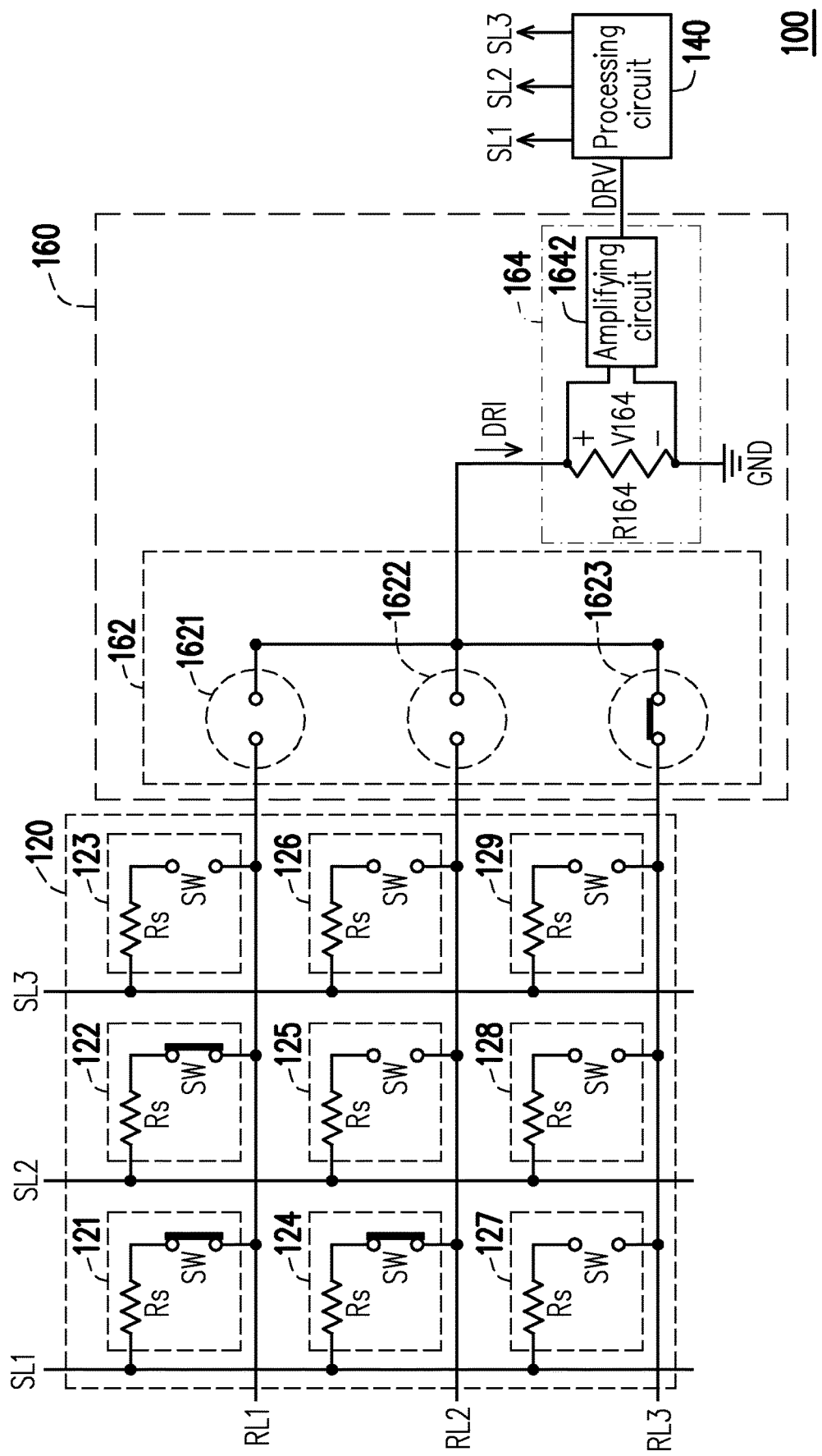
FIG. 2C is a schematic diagram of an equivalent circuit of the keyboard apparatus of FIG. 1 in yet another specific case.

Referring to FIG. 2A, FIG. 2B, and FIG. 2C together, FIG. 2A is a schematic diagram of an equivalent circuit of FIG. 1 when the return switch 1621 is turned on and the return switches 1622 and 1623 are turned off in a case where the keys 121, 122, and 124 are pressed and the keys 123, 125-129 are not pressed in FIG. 1; FIG. 2B is a schematic diagram of an equivalent circuit of FIG. 1 when the return switch 1622 is turned on and the return switches 1621 and 1623 are turned off in a case where the keys 121, 122, and 124 are pressed and the keys 123, 125-129 are not pressed in FIG. 1; FIG. 2C is a schematic diagram of an equivalent circuit of FIG. 1 when the return switch 1623 is turned on and the return switches 1621 and 1622 are turned off in a case where the keys 121, 122, and 124 are pressed and the keys 123, 125-129 are not pressed in FIG. 1.

In FIG. 2A, when the scan line SL1 is activated, the voltage applied to the scan line SL1 is a logical high level (e.g., 5V), and the voltage applied to the scan line SL2 and the scan line SL3 is a logical low level (e.g., an electric potential of the ground voltage terminal GND, which is 0V) or a high impedance electric potential. Since the resistance value of the resistor R164 is much smaller than the resistance value of the resistor Rs of the key 122, the current flowing, from the scan line SL1, through the resistor Rs and the switch SW of the key 121 and the return line RL1 is almost equal to the detection current DRI flowing into the resistor R164. At this time, the detection current DRI is about 1 mA (i.e., 5V÷(4.7+0.033)KΩ≈1 mA), and the detection voltage DRV generated by the current-to-voltage converter 164 is about 4.95V (i.e., 150×0.033KΩ×1 mA=4.95V). Thus, the processing circuit 140 may determine that the detection voltage DRV is larger than the first reference voltage (e.g., 4V, but is not limited thereto) and thus the key 121 is pressed.

In FIG. 2A, when the scan line SL2 is activated, the voltage applied to the scan line SL2 is a logical high level (e.g., 5V), and the voltage applied to the scan line SL1 and the scan line SL3 is a logical low level (e.g., an electric potential of the ground voltage terminal GND, which is 0V) or a high impedance electric potential. Since the resistance value of the resistor R164 is much smaller than the resistance value of the resistor Rs of the key 121, the current flowing, from the scan line SL2, through the resistor Rs and the switch SW of the key 122 and the return line RL1 is almost equal to the detection current DRI flowing into the resistor R164. At this time, the detection current DRI is about 1 mA (i.e., 5V÷(4.7+0.033)KΩ≈1 mA), and the detection voltage DRV generated by the current-to-voltage converter 164 is about 4.95V (i.e., 150×0.033KΩ×1 mA=4.95V). Thus, the processing circuit 140 may determine that the detection voltage DRV is larger than the first reference voltage (e.g., 4V, but is not limited thereto) and thus the key 122 is pressed.

In FIG. 2A, when the scan line SL3 is activated, the voltage applied to the scan line SL3 is a logical high level (e.g., 5V), and the voltage applied to the scan line SL1 and the scan line SL2 is a logical low level (e.g., an electric potential of the ground voltage terminal GND, which is 0V) or a high impedance electric potential. At this time, since the switch SW of the key 123 is in an off state, the detection current DRI is 0 mA, and the detection voltage DRV generated by the current-to-voltage converter 164 is 0V. Thus, the processing circuit 140 may determine that the detection voltage DRV is smaller than the second reference voltage (e.g., 1V, but is not limited thereto) and thus the key 123 is not pressed.

In FIG. 2B, when the scan line SL1 is activated, the voltage applied to the scan line SL1 is a logical high level (e.g., 5V), and the voltage applied to the scan line SL2 and the scan line SL3 is a logical low level (e.g., an electric potential of the ground voltage terminal GND, which is 0V) or a high impedance electric potential. In this case, the current flowing, from the scan line SL1, through the resistor Rs and the switch SW of the key 124 and the return line RL2 is equal to the detection current DRI flowing into the resistor R164. At this time, the detection current DRI is about 1 mA (i.e., 5V÷(4.7+0.033)KΩ≈1 mA), and the detection voltage DRV generated by the current-to-voltage converter 164 is about 4.95V (i.e., 150×0.033KΩ×1 mA=4.95V). Thus, the processing circuit 140 may determine that the detection voltage DRV is larger than the first reference voltage (e.g., 4V, but is not limited thereto) and thus the key 124 is pressed.

In FIG. 2B, when the scan line SL2 is activated, the voltage applied to the scan line SL2 is a logical high level (e.g., 5V), and the voltage applied to the scan line SL1 and the scan line SL3 is a logical low level (e.g., an electric potential of the ground voltage terminal GND, which is 0V) or a high impedance electric potential. At this time, since the switch SW of the key 125 is in an off state, the detection current DRI is 0 mA, and the detection voltage DRV generated by the current-to-voltage converter 164 is 0V. Thus, the processing circuit 140 may determine that the detection voltage DRV is smaller than the second reference voltage (e.g., 1V, but is not limited thereto) and thus the key 125 is not pressed.

In FIG. 2B, when the scan line SL3 is activated, the voltage applied to the scan line SL3 is a logical high level (e.g., 5V), and the voltage applied to the scan line SL1 and the scan line SL2 is a logical low level (e.g., an electric potential of the ground voltage terminal GND, which is 0V) or a high impedance electric potential. At this time, since the switch SW of the key 126 is in an off state, the detection current DRI is 0 mA, and the detection voltage DRV generated by the current-to-voltage converter 164 is 0V. Thus, the processing circuit 140 may determine that the detection voltage DRV is smaller than the second reference voltage (e.g., 1V, but is not limited thereto) and thus the key 126 is not pressed.

In a similar fashion, in FIG. 2C, when the scan lines SL1, SL2, and SL3 are sequentially activated, the processing circuit 140 may sequentially infer that the keys 127, 128, and 129 are not pressed.

Generally speaking, in a case where the keys 121, 122, and 124 are pressed and the keys 123, 125-129 are not pressed, based on the physical characteristic of the key matrix itself, the key 125 is prone to the ghost key. However, by the detection circuit 160 in FIG. 1 of the disclosure, the processing circuit 140 can correctly determine whether each of the keys 121-129 is pressed, and thus the ghost key phenomenon can be avoided. In addition, the plurality of return lines RL1-RL3 in the keyboard apparatus 100 in FIG. 1 of the disclosure only need using one current-to-voltage converter 164 to detect the current, and the processing circuit 140 can sequentially determine whether each of the keys 121-129 is pressed. Thus, the manufacturing cost of the keyboard apparatus 100 can be reduced.

Likewise, in a case where the keys 121-128 are pressed and the key 129 is not pressed, by the detection circuit 160 in FIG. 1 of the disclosure, the processing circuit 140 can correctly determine whether each of the keys 121-129 is pressed, and thus the ghost key phenomenon can be avoided. The operation details related to the detection circuit 160 and the processing circuit 140 in a case where the keys 121-128 are pressed and the key 129 is not pressed may be inferred from the related descriptions of FIG. 2A to FIG. 2C above, and thus are not repeated hereinafter.

Figure 3:
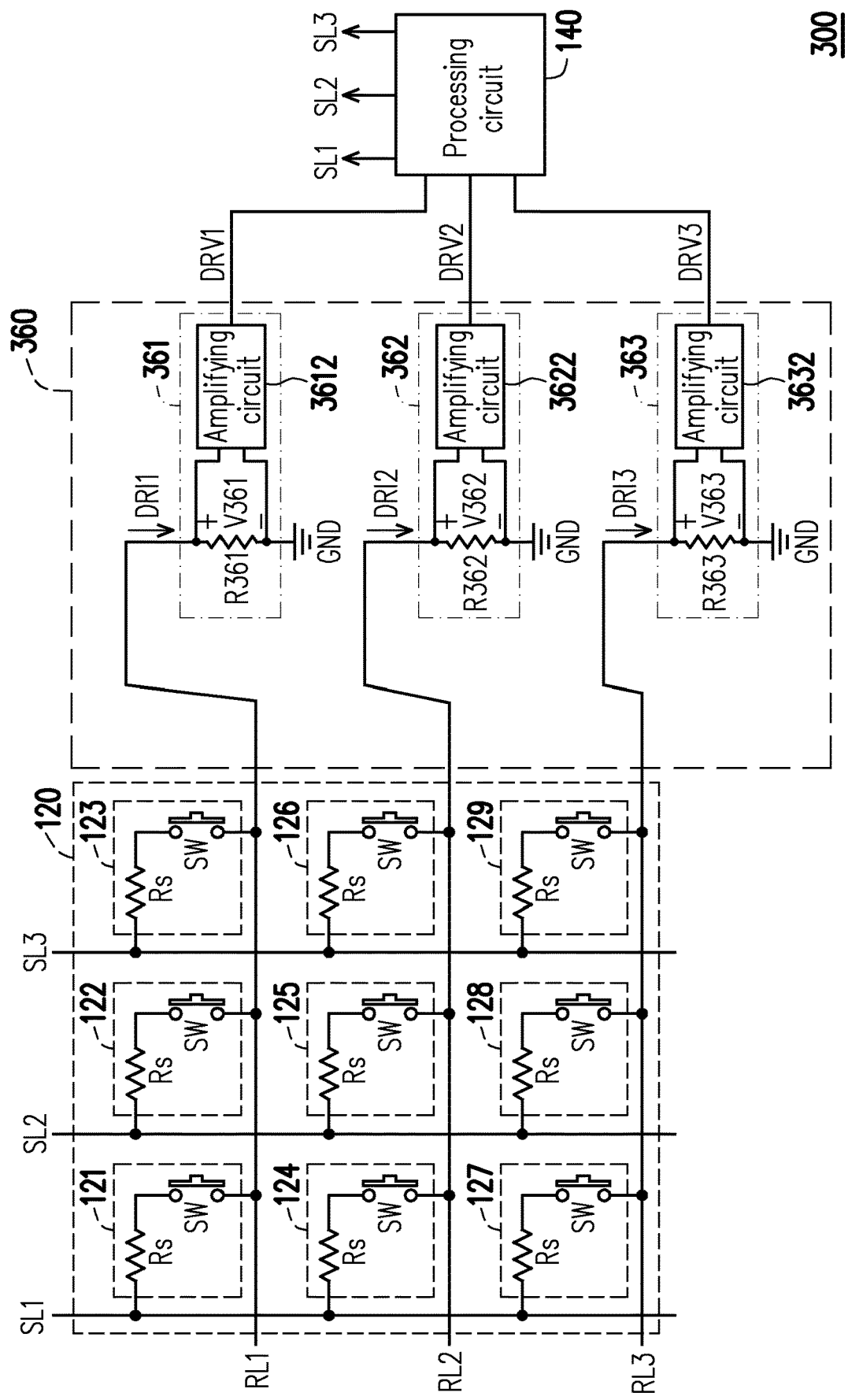
FIG. 3 is a schematic diagram illustrating a keyboard apparatus according to another embodiment of the disclosure.

Referring to FIG. 3, FIG. 3 is a schematic diagram illustrating a keyboard apparatus 300 according to another embodiment of the disclosure. The keyboard apparatus 300 may include the key module 120, a detection circuit 360, and the processing circuit 140, but the disclosure is not limited thereto. The embodiments of the key module 120 and the processing circuit 140 of FIG. 3 are respectively similar to the key module 120 and the processing circuit 140 of FIG. 1 and may be referred to the above related descriptions, and thus are not repeated.

The detection circuit 360 is coupled to the return lines RL1-RL3 and the processing circuit 140. The detection circuit 360 is configured to detect the current flowing through each of the return lines RL1-RL3 and indicate that the switch SW of each of the keys 121-129 is in an on state or in an off state according to the value of the detected current of each of the return lines RL1-RL3.

Furthermore, in the embodiment shown in FIG. 3, the detection circuit 360 may include current-to-voltage converters 361-363. The current-to-voltage converter 361 is coupled between the return line RL1 and the first voltage terminal, the current-to-voltage converter 362 is coupled between the return line RL2 and the first voltage terminal, and the current-to-voltage converter 363 is coupled between the return line RL3 and the first voltage terminal, wherein the first voltage terminal may be the ground voltage terminal GND, for example, but the disclosure is not limited thereto.

The current-to-voltage converter 361 is configured to detect the current of the return line RL1 to obtain a detection current DRI1 and convert the detection current DRI1 into a detection voltage DRV1 to indicate that the switch SW of each of the keys 121-123 coupled to the return line RL1 is in an on state or in an off state. The current-to-voltage converter 362 is configured to detect the current of the return line RL2 to obtain a detection current DRI2 and convert the detection current DRI2 into a detection voltage DRV2 to indicate that the switch SW of each of the keys 124-126 coupled to the return line RL2 is in an on state or in an off state. Likewise, the current-to-voltage converter 363 is configured to detect the current of the return line RL3 to obtain a detection current DRI3 and convert the detection current DRI3 into a detection voltage DRV3 to indicate that the switch SW of each of the keys 127-129 coupled to the return line RL3 is in an on state or in an off state.

In an embodiment of the disclosure, the current-to-voltage converter 361 may include a resistor R361 and an amplifying circuit 3612. The resistor R361 is coupled between the return line RL1 and the ground voltage terminal GND, and generates a voltage difference V361 between two terminals of the resistor R361 in response to the detection current DRI1. The amplifying circuit 3612 is coupled to the two terminals of the resistor R361 to receive the voltage difference V361, and amplifies the voltage difference V361 to generate the detection voltage DRV1. The current-to-voltage converter 362 may include a resistor R362 and an amplifying circuit 3622. The resistor R362 is coupled between the return line RL2 and the ground voltage terminal GND, and generates a voltage difference V362 between two terminals of the resistor R362 in response to the detection current DRI2. The amplifying circuit 3622 is coupled to the two terminals of the resistor R362 to receive the voltage difference V362, and amplifies the voltage difference V362 to generate the detection voltage DRV2. Likewise, the current-to-voltage converter 363 may include a resistor R363 and an amplifying circuit 3632. The resistor R363 is coupled between the return line RL3 and the ground voltage terminal GND, and generates a voltage difference V363 between two terminals of the resistor R363 in response to the detection current DRI3. The amplifying circuit 3632 is coupled to the two terminals of the resistor R363 to receive the voltage difference V363, and amplifies the voltage difference V363 to generate the detection voltage DRV3.

The operation of the keyboard apparatus 300 is similar to that of the keyboard apparatus 100 of FIG. 1. The only difference between the two is that: the detection circuit 160 of FIG. 1 can only detect the current of one of the return lines RL1-RL3 at one time (based on that the three return lines RL1-RL3 share the one current-to-voltage converter 164), but the detection circuit 360 of FIG. 3 can detect the current of each of the return lines RL1-RL3 simultaneously (based on that the currents of the return lines RL1-RL3 are respectively detected by the corresponding current-to-voltage converters 361-363). Thus, a key detection speed of the keyboard apparatus 300 of FIG. 3 is three times a key detection speed of the keyboard apparatus 100 of FIG. 1. The operation details related to the keyboard apparatus 300 of FIG. 3 may be inferred from the related descriptions of FIG. 1, FIG. 2A to FIG. 2C above, and thus are not repeated.

Figure 4:
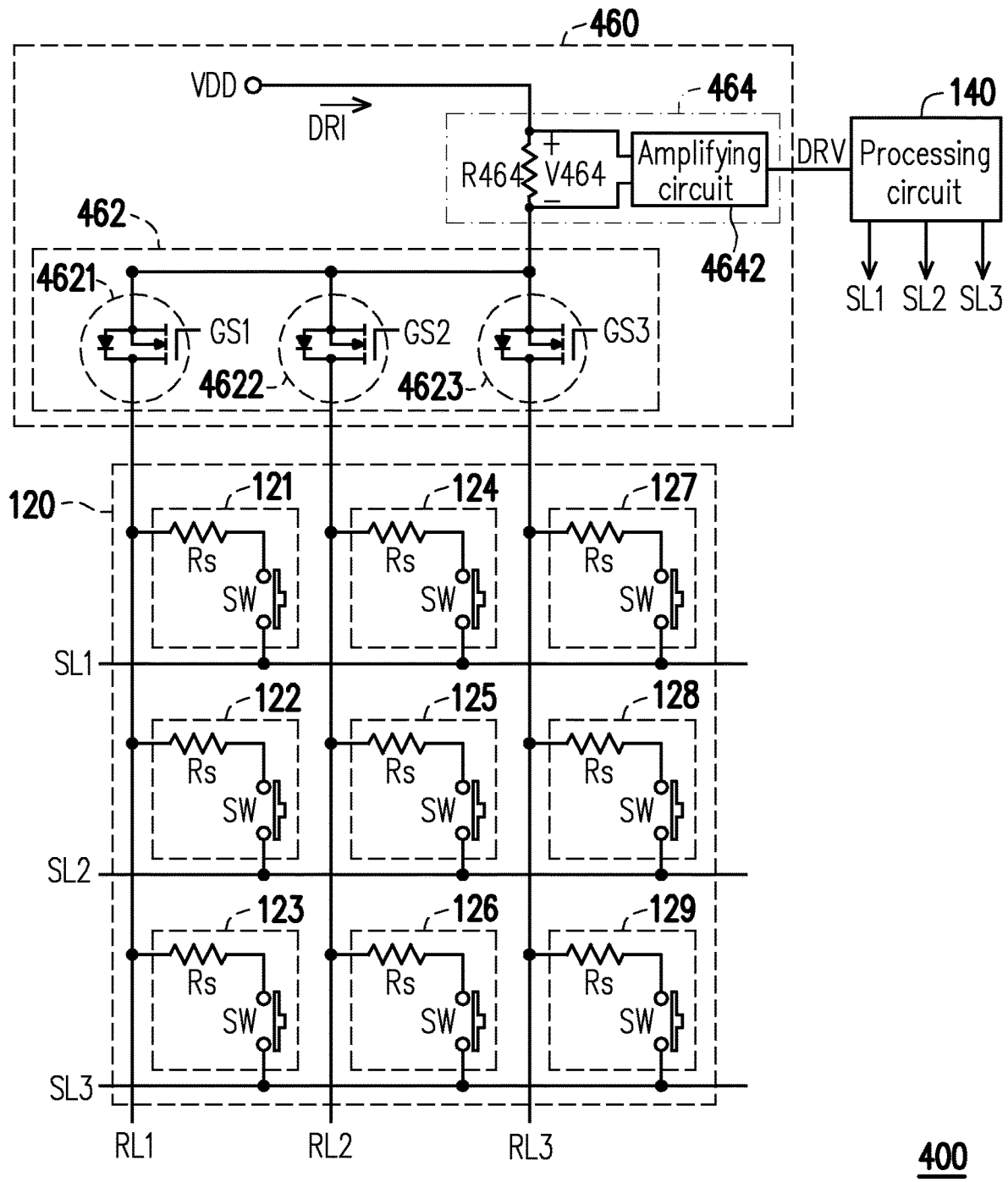
FIG. 4 is a schematic diagram illustrating a keyboard apparatus according to yet another embodiment of the disclosure.

Referring to FIG. 4, FIG. 4 is a schematic diagram illustrating a keyboard apparatus 400 according to yet another embodiment of the disclosure. The keyboard apparatus 400 may include the key module 120, a detection circuit 460, and the processing circuit 140, but the disclosure is not limited thereto. The embodiments of the key module 120 and the processing circuit 140 of FIG. 4 are respectively similar to the key module 120 and the processing circuit 140 of FIG. 1 and may be referred to the above related descriptions, and thus are not repeated.

The detection circuit 460 is coupled to the return lines RL1-RL3 and the processing circuit 140. The detection circuit 460 is configured to detect the current flowing through each of the return lines RL1-RL3 and indicate that the switch SW of each of the keys 121-129 is in an on state or in an off state according to the value of the detected current of each of the return lines RL1-RL3.

Furthermore, in the embodiment shown in FIG. 4, the detection circuit 460 may include a selection circuit 462 and a current-to-voltage converter 464. The selection circuit 462 is coupled to the return lines RL1-RL3. The current-to-voltage converter 464 is coupled between the selection circuit 462 and the first voltage terminal, wherein the first voltage terminal may be a power voltage terminal VDD, for example, but the disclosure is not limited thereto. The selection circuit 462 may be controlled by the selection signals GS1-GS3, which are generated by the processing circuit 140, so as to choose one of the return lines RL1-RL3 to be the selected return line (e.g., the return line RL1) and conduct the current path between the current-to-voltage converter 464 and the selected return line (the return line RL1), such that the current-to-voltage converter 464 detects the current flowing through the selected return line (the return line RL1) to serve as the detection current DRI. Additionally, the current-to-voltage converter 464 may convert the detection current DRI into the detection voltage DRV and accordingly indicate that the switch SW of each the key coupled to the selected return line (the return line RL1) is in an on state or in an off state.

In an embodiment of the disclosure, the selection circuit 462 may include return switches 4621-4623, wherein the return switches 4621-4623 may be implemented by using P-type metal oxide semiconductor field effect transistors (PMOS FET), but the disclosure is not limited thereto. A first terminal of the return switch 4621 is coupled to the return line RL1, a second terminal of the return switch 4621 is coupled to the current-to-voltage converter 464, and a control terminal of the return switch 4621 receives the selection signal GS1. A first terminal of the return switch 4622 is coupled to the return line RL2, a second terminal of the return switch 4622 is coupled to the current-to-voltage converter 464, and a control terminal of the return switch 4622 receives the selection signal GS2. A first terminal of the return switch 4623 is coupled to the return line RL3, a second terminal of the return switch 4623 is coupled to the current-to-voltage converter 464, and a control terminal of the return switch 4623 receives the selection signal GS3. In other embodiments of the disclosure, the selection circuit 462 may also be implemented by using a multiplexer or a de-multiplexer.

In an embodiment of the disclosure, the current-to-voltage converter 464 may include a resistor R464 and an amplifying circuit 4642. The resistor R464 is coupled between the second terminal of each of the return switches 4621-4623 and the power voltage terminal VDD, and may generate a voltage difference V464 between two terminals of the resistor R464 in response to the detection current DRI. Particularly, a resistance value of the resistor R464 is much smaller than a resistance value of the resistor Rs in each of the keys 121-129. The amplifying circuit 4642 is coupled to the two terminals of the resistor R464 to receive the voltage difference V464, and amplifies the voltage difference V464 to generate the detection voltage DRV.

The operation of the keyboard apparatus 400 will be described below. For convenience of explanation, in the following embodiments, it is assumed that a logical high level and an electric potential of the power voltage terminal VDD are 5V, a logical low level is 0V, a resistance value of the resistor Rs of each of the keys 121-129 is 4.7 kilo-ohms (KO), a resistance value of the resistor R464 is 33 ohms (a), and an amplification of the amplifying circuit 4642 is 150 times, but the disclosure is not limited thereto.

When the processing circuit 140 generates the selection signals GS1-GS3 to turn on the return switch 4621 and turn off the return switch 4622 and the return switch 4623, the detection circuit 460 may detect the current flowing through the return line RL1 to serve as the detection current DRI and accordingly indicate that the switch SW of each of the keys 121-123 coupled to the return line RL1 is in an on state or in an off state.

For instance, when the scan line SL1 is activated, the voltage applied to the scan line SL1 is a logical low level (e.g., 0V), and the voltage applied to the scan line SL2 and the scan line SL3 is a logical high level (e.g., 5V) or a high impedance electric potential. Therefore, if the key 121 is pressed such that the switch SW of the key 121 is turned on, the power voltage terminal VDD, the resistor R464, the return switch 4621, the return line RL1, the resistor Rs and the switch SW of the key 121, and the scan line SL1 will form a closed loop to generate a current. At this time, the current of the return line RL1 (i.e., the detection current DRI) is about 1 mA (i.e., 5V÷(4.7+0.033)KΩ≈1 mA), and the detection voltage DRV generated by the current-to-voltage converter 464 is about 4.95V (i.e., 150×0.033KΩ×1 mA=4.95V). On the other hand, if the key 121 is not pressed such that the switch SW of the key 121 is not turned on, the detection current DRI is 0 mA, and the detection voltage DRV generated by the current-to-voltage converter 464 is 0V. Thus, when the scan line SL1 is activated, the detection circuit 460 may indicate that the switch SW of the key 121 is in an on state or in an off state according to the value of the detection current DRI, and the processing circuit 140 may determine whether the key 121 is pressed according to the detection voltage DRV converted by the detection circuit 460. For instance, if the detection voltage DRV is larger than the first reference voltage, the processing circuit 140 may determine that the key 121 is pressed. On the other hand, if the detection voltage DRV is smaller than the second reference voltage, the processing circuit 140 may determine that the key 121 is not pressed, wherein the second reference voltage is smaller than or equal to the first reference voltage.

Likewise, when the scan line SL2 is activated, the voltage applied to the scan line SL2 is a logical low level (e.g., 0V), and the voltage applied to the scan line SL1 and the scan line SL3 is a logical high level (e.g., 5V) or a high impedance electric potential. Therefore, if the key 122 is pressed such that the switch SW of the key 122 is turned on, the power voltage terminal VDD, the resistor R464, the return switch 4621, the return line RL1, the resistor Rs and the switch SW of the key 122, and the scan line SL2 will form a closed loop to generate a current. At this time, the current of the return line RL1 (i.e., the detection current DRI) is about 1 mA (i.e., 5V÷(4.7+0.033)KΩ≈1 mA), and the detection voltage DRV generated by the current-to-voltage converter 464 is about 4.95V (i.e., 150×0.033KΩ×1 mA=4.95V). On the other hand, if the key 122 is not pressed such that the switch SW of the key 122 is not turned on, the detection current DRI is 0 mA, and the detection voltage DRV generated by the current-to-voltage converter 464 is 0V. Thus, when the scan line SL2 is activated, the detection circuit 460 may indicate that the switch SW of the key 122 is in an on state or in an off state according to the value of the detection current DRI, and the processing circuit 140 may determine whether the key 122 is pressed according to the detection voltage DRV converted by the detection circuit 460.

Likewise, when the scan line SL3 is activated, the voltage applied to the scan line SL3 is a logical low level (e.g., 0V), and the voltage applied to the scan line SL1 and the scan line SL2 is a logical high level (e.g., 5V) or a high impedance electric potential. Therefore, if the key 123 is pressed such that the switch SW of the key 123 is turned on, the power voltage terminal VDD, the resistor R464, the return switch 4621, the return line RL1, the resistor Rs and the switch SW of the key 123, and the scan line SL3 will form a closed loop to generate a current. At this time, the current of the return line RL1 (i.e., the detection current DRI) is about 1 mA (i.e., 5V÷(4.7+0.033)KΩ≈1 mA), and the detection voltage DRV generated by the current-to-voltage converter 464 is about 4.95V (i.e., 150×0.033KΩ×1 mA=4.95V). On the other hand, if the key 123 is not pressed such that the switch SW of the key 123 is not turned on, the detection current DRI is 0 mA, and the detection voltage DRV generated by the current-to-voltage converter 464 is 0V. Thus, when the scan line SL3 is activated, the detection circuit 460 may indicate that the switch of the key 123 is in an on state or in an off state according to the value of the detection current DRI, and the processing circuit 140 may determine whether the key 123 is pressed according to the detection voltage DRV converted by the detection circuit 460.

On the other hand, when the processing circuit 140 generates the selection signals GS1-GS3 to turn on the return switch 4622 and turn off the return switch 4621 and the return switch 4623, the detection circuit 460 may detect the current flowing through the return line RL2 to serve as the detection current DRI and accordingly indicate that the switch SW of each of the keys 124-126 coupled to the return line RL2 is in an on state or in an off state, and the processing circuit 140 may determine whether each of the keys 124-126 is pressed according to the detection voltage DRV converted by the detection circuit 460. The operation details may be inferred from the related descriptions above, and thus are not repeated.

Likewise, when the processing circuit 140 generates the selection signals GS1-GS3 to turn on the return switch 4623 and turn off the return switch 4621 and the return switch 4622, the detection circuit 460 may detect the current flowing through the return line RL3 to serve as the detection current DRI and accordingly indicate that the switch SW of each of the keys 127-129 coupled to the return line RL3 is in an on state or in an off state, and the processing circuit 140 may determine whether each of the keys 127-129 is pressed according to the detection voltage DRV converted by the detection circuit 460. The operation details may be inferred from the related descriptions above, and thus are not repeated.

Figure 5A:
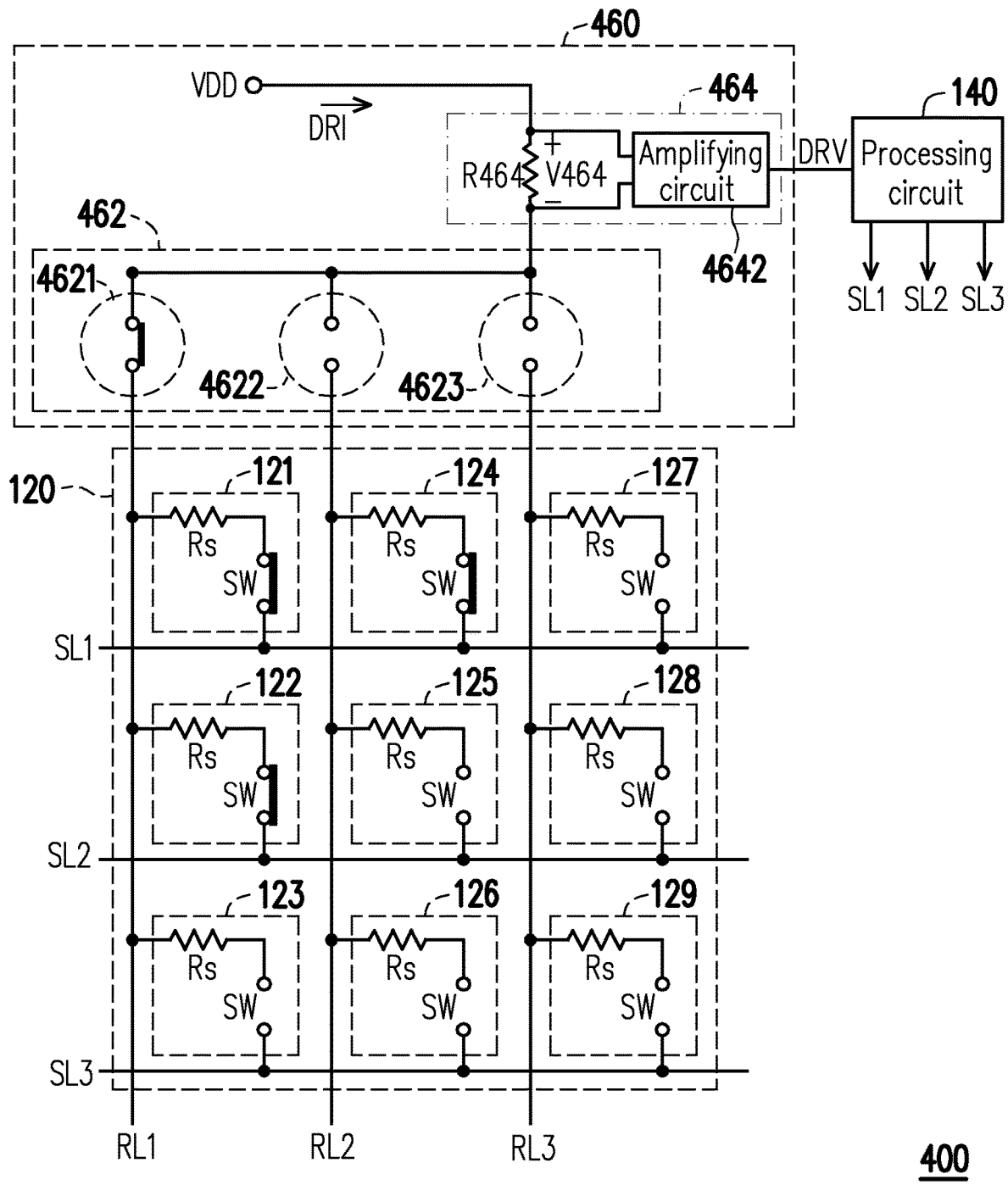
FIG. 5A is a schematic diagram of an equivalent circuit of the keyboard apparatus of FIG. 4 in a specific case.
Figure 5B:
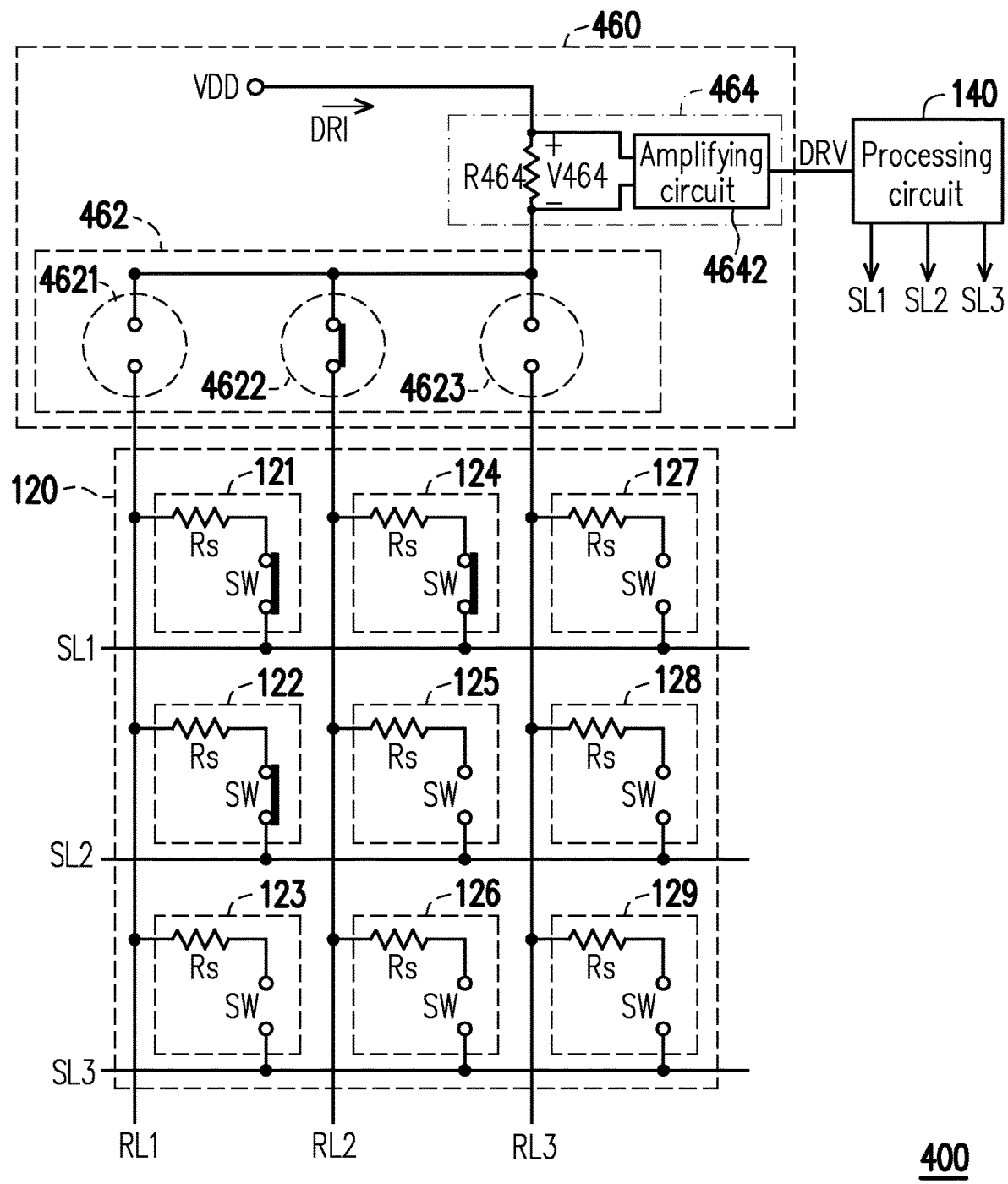
FIG. 5B is a schematic diagram of an equivalent circuit of the keyboard apparatus of FIG. 4 in another specific case.
Figure 5C:
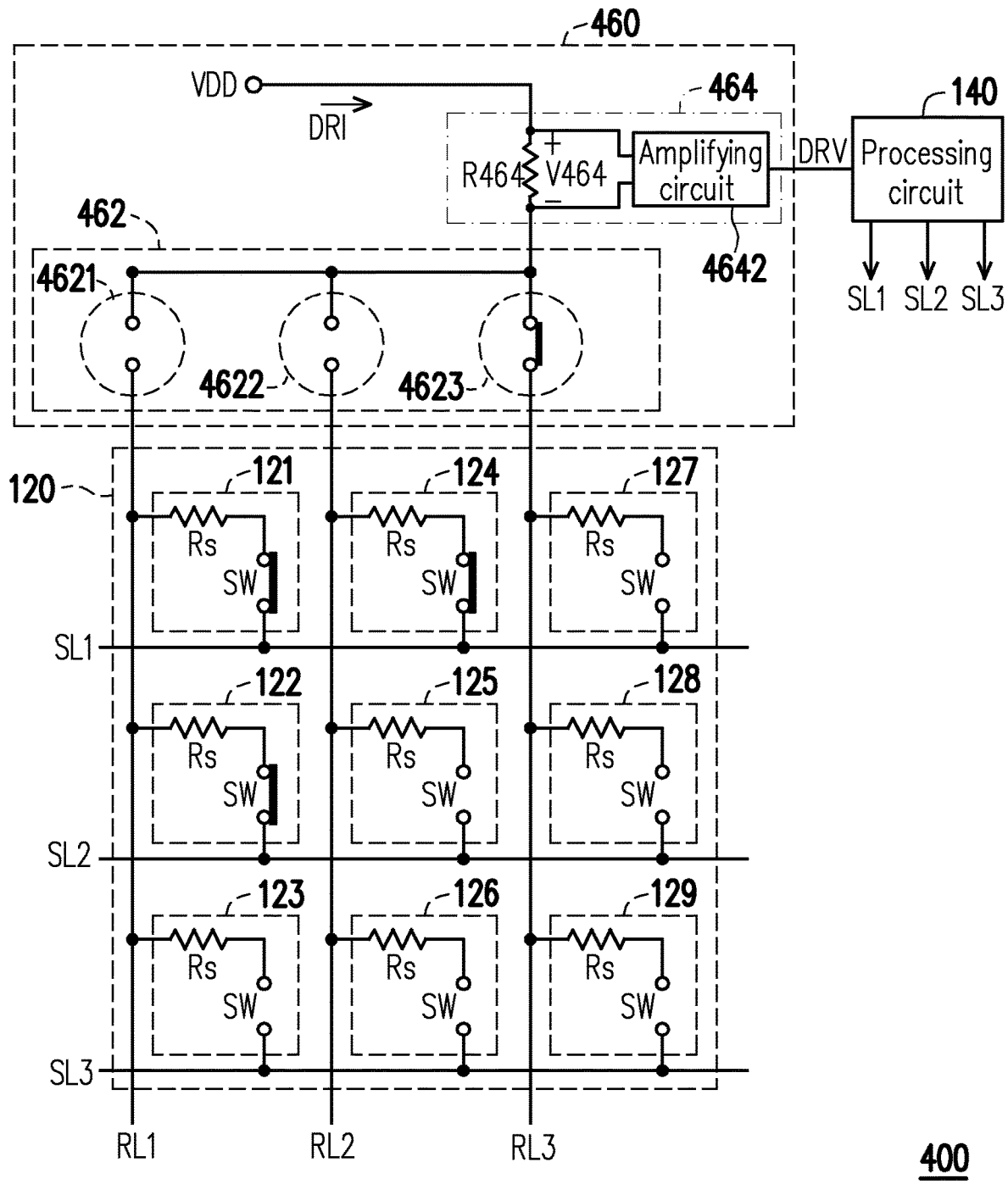
FIG. 5C is a schematic diagram of an equivalent circuit of the keyboard apparatus of FIG. 4 in yet another specific case.

Referring to FIG. 5A, FIG. 5B, and FIG. 5C together, FIG. 5A is a schematic diagram of an equivalent circuit of FIG. 4 when the return switch 4621 is turned on and the return switches 4622 and 4623 are turned off in a case where the keys 121, 122, and 124 are pressed and the keys 123, 125-129 are not pressed in FIG. 4; FIG. 5B is a schematic diagram of an equivalent circuit of FIG. 4 when the return switch 4622 is turned on and the return switches 4621 and 4623 are turned off in a case where the keys 121, 122, and 124 are pressed and the keys 123, 125-129 are not pressed in FIG. 4; FIG. 5C is a schematic diagram of an equivalent circuit of FIG. 4 when the return switch 4623 is turned on and the return switches 4621 and 4622 are turned off in a case where the keys 121, 122, and 124 are pressed and the keys 123, 125-129 are not pressed in FIG. 4.

In FIG. 5A, when the scan line SL1 is activated, the voltage applied to the scan line SL1 is a logical low level (e.g., 0V), and the voltage applied to the scan line SL2 and the scan line SL3 is a logical high level (e.g., an electric potential of the power voltage terminal VDD, which is 5V) or a high impedance electric potential. Since the resistance value of the resistor R464 is much smaller than the resistance value of the resistor Rs of the key 122, the current flowing through the return line RL1 and the resistor Rs and the switch SW of the key 121 is almost equal to the detection current DRI flowing into the resistor R464. At this time, the detection current DRI is about 1 mA (i.e., 5V÷(4.7+ 0.033KΩ≈1 mA), and the detection voltage DRV generated by the current-to-voltage converter 464 is about 4.95V (i.e., 150×0.033KΩ×1 mA=4.95V). Thus, the processing circuit 140 may determine that the detection voltage DRV is larger than the first reference voltage (e.g., 4V, but is not limited thereto) and thus the key 121 is pressed.

In FIG. 5A, when the scan line SL2 is activated, the voltage applied to the scan line SL2 is a logical low level (e.g., 0V), and the voltage applied to the scan line SL1 and the scan line SL3 is a logical high level (e.g., an electric potential of the power voltage terminal VDD, which is 5V) or a high impedance electric potential. Since the resistance value of the resistor R464 is much smaller than the resistance value of the resistor Rs of the key 121, the current flowing through the return line RL1 and the resistor Rs and the switch SW of the key 122 is almost equal to the detection current DRI flowing into the resistor R464. At this time, the detection current DRI is about 1 mA (i.e., 5V÷(4.7+0.033) KΩ≈1 mA), and the detection voltage DRV generated by the current-to-voltage converter 464 is about 4.95V (i.e., 150× 0.033KΩ×1 mA=4.95V). Thus, the processing circuit 140 may determine that the detection voltage DRV is larger than the first reference voltage (e.g., 4V, but is not limited thereto) and thus the key 122 is pressed.

In FIG. 5A, when the scan line SL3 is activated, the voltage applied to the scan line SL3 is a logical low level (e.g., 0V), and the voltage applied to the scan line SL1 and the scan line SL2 is a logical high level (e.g., an electric potential of the power voltage terminal VDD, which is 5V) or a high impedance electric potential. At this time, since the switch SW of the key 123 is in an off state, the detection current DRI is 0 mA, and the detection voltage DRV generated by the current-to-voltage converter 464 is 0V. Thus, the processing circuit 140 may determine that the detection voltage DRV is smaller than the second reference voltage (e.g., 1V, but is not limited thereto) and thus the key 123 is not pressed.

In FIG. 5B, when the scan line SL1 is activated, the voltage applied to the scan line SL1 is a logical low level (e.g., 0V), and the voltage applied to the scan line SL2 and the scan line SL3 is a logical high level (e.g., an electric potential of the power voltage terminal VDD, which is 5V) or a high impedance electric potential. In this case, the current flowing through the return line RL2 and the resistor Rs and the switch SW of the key 124 is equal to the detection current DRI flowing into the resistor R464. At this time, the detection current DRI is about 1 mA (i.e., 5V÷(4.7+0.033) KΩ≈1 mA), and the detection voltage DRV generated by the current-to-voltage converter 464 is about 4.95V (i.e., 150× 0.033KΩ×1 mA=4.95V). Thus, the processing circuit 140 may determine that the detection voltage DRV is larger than the first reference voltage (e.g., 4V, but is not limited thereto) and thus the key 124 is pressed.

In FIG. 5B, when the scan line SL2 is activated, the voltage applied to the scan line SL2 is a logical low level (e.g., 0V), and the voltage applied to the scan line SL1 and the scan line SL3 is a logical high level (e.g., an electric potential of the power voltage terminal VDD, which is 5V) or a high impedance electric potential. At this time, since the switch SW of the key 125 is in an off state, the detection current DRI is 0 mA, and the detection voltage DRV generated by the current-to-voltage converter 464 is 0V. Thus, the processing circuit 140 may determine that the detection voltage DRV is smaller than the second reference voltage (e.g., 1V, but is not limited thereto) and thus the key 125 is not pressed.

In FIG. 5B, when the scan line SL3 is activated, the voltage applied to the scan line SL3 is a logical low level (e.g., 0V), and the voltage applied to the scan line SL1 and the scan line SL2 is a logical high level (e.g., an electric potential of the power voltage terminal VDD, which is 5V) or a high impedance electric potential. At this time, since the switch SW of the key 126 is in an off state, the detection current DRI is 0 mA, and the detection voltage DRV generated by the current-to-voltage converter 464 is 0V. Thus, the processing circuit 140 may determine that the detection voltage DRV is smaller than the second reference voltage (e.g., 1V, but is not limited thereto) and thus the key 126 is not pressed.

In a similar fashion, in FIG. 2C, when the scan lines SL1, SL2, and SL3 are sequentially activated, the processing circuit 140 may sequentially infer that the keys 127, 128, and 129 are not pressed.

It can be seen that by the detection circuit 460 in FIG. 4 of the disclosure, the processing circuit 140 can correctly determine whether each of the keys 121-129 is pressed, and thus the ghost key phenomenon can be avoided. In addition, the plurality of return lines RL1-RL3 in the keyboard apparatus 400 in FIG. 4 of the disclosure only need using the one current-to-voltage converter 464 to detect the current, and the processing circuit 140 can sequentially determine whether each of the keys 121-129 is pressed. Thus, the manufacturing cost of the keyboard apparatus 400 can be reduced.

Likewise, in a case where the keys 121-128 are pressed and the key 129 is not pressed, by the detection circuit 460 in FIG. 4 of the disclosure, the processing circuit 140 can correctly determine whether each of the keys 121-129 is pressed, and thus the ghost key phenomenon can be avoided. The operation details related to the detection circuit 460 and the processing circuit 140 in a case where the keys 121-128 are pressed and the key 129 is not pressed may be inferred from the related descriptions of FIG. 5A to FIG. 5C above, and thus are not repeated.

Figure 6:
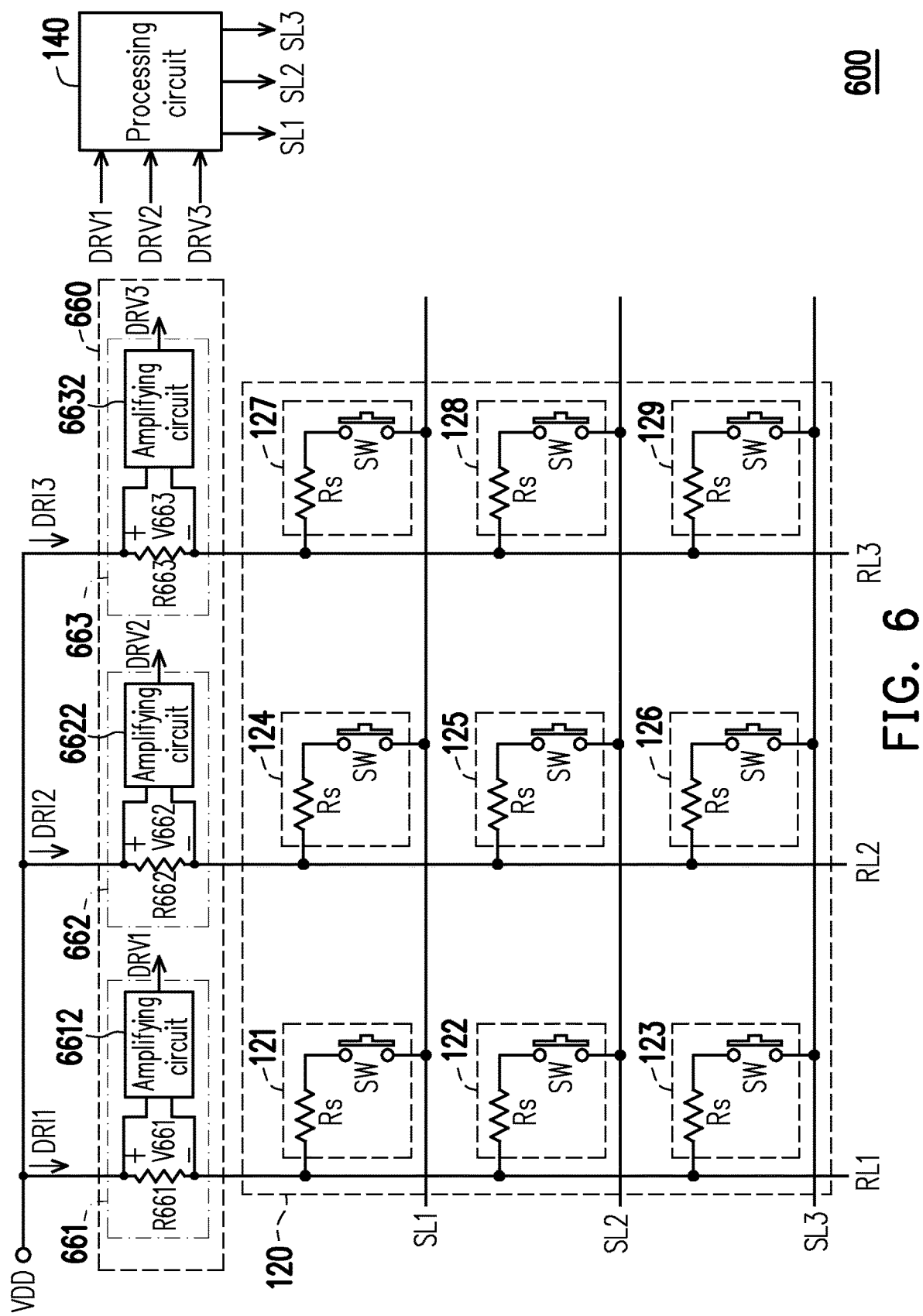
FIG. 6 is a schematic diagram illustrating a keyboard apparatus according to yet another embodiment of the disclosure.

Referring to FIG. 6, FIG. 6 is a schematic diagram illustrating a keyboard apparatus 600 according to yet another embodiment of the disclosure. The keyboard apparatus 600 may include the key module 120, a detection circuit 660, and the processing circuit 140, but the disclosure is not limited thereto. The embodiments of the key module 120 and the processing circuit 140 of FIG. 6 are respectively similar to the key module 120 and the processing circuit 140 of FIG. 4 and may be referred to the above related descriptions, and thus are not repeated.

The detection circuit 660 is coupled to the return lines RL1-RL3 and the processing circuit 140. The detection circuit 660 is configured to detect the current flowing through each of the return lines RL1-RL3 and indicate that the switch SW of each of the keys 121-129 is in an on state or in an off state according to the value of the detected current of each of the return lines RL1-RL3.

Furthermore, in the embodiment shown in FIG. 6, the detection circuit 660 may include current-to-voltage converters 661-663. The current-to-voltage converter 661 is coupled between the return line RL1 and the first voltage terminal, the current-to-voltage converter 662 is coupled between the return line RL2 and the first voltage terminal, and the current-to-voltage converter 663 is coupled between the return line RL3 and the first voltage terminal, wherein the first voltage terminal may be the power voltage terminal VDD, for example, but the disclosure is not limited thereto.

The current-to-voltage converter 661 is configured to detect the current of the return line RL1 to obtain the detection current DRI1 and convert the detection current DRI1 into the detection voltage DRV1 to indicate that the switch SW of each of the keys 121-123 coupled to the return line RL1 is in an on state or in an off state. The current-to-voltage converter 662 is configured to detect the current of the return line RL2 to obtain the detection current DRI2 and convert the detection current DRI2 into the detection voltage DRV2 to indicate that the switch SW of each of the keys 124-126 coupled to the return line RL2 is in an on state or in an off state. Likewise, the current-to-voltage converter 663 is configured to detect the current of the return line RL3 to obtain the detection current DRI3 and convert the detection current DRI3 into the detection voltage DRV3 to indicate that the switch SW of each of the keys 127-129 coupled to the return line RL3 is in an on state or in an off state.

In an embodiment of the disclosure, the current-to-voltage converter 661 may include a resistor R661 and an amplifying circuit 6612. The resistor R661 is coupled between the return line RL1 and the power voltage terminal VDD, and generates a voltage difference V661 between two terminals of the resistor R661 in response to the detection current DRI1. The amplifying circuit 6612 is coupled to the two terminals of the resistor R661 to receive the voltage difference V661, and amplifies the voltage difference V661 to generate the detection voltage DRV1. The current-to-voltage converter 662 may include a resistor R662 and an amplifying circuit 6622. The resistor R662 is coupled between the return line RL2 and the power voltage terminal VDD, and generates a voltage difference V662 between two terminals of the resistor R662 in response to the detection current DRI2. The amplifying circuit 6622 is coupled to the two terminals of the resistor R662 to receive the voltage difference V662, and amplifies the voltage difference V662 to generate the detection voltage DRV2. Likewise, the current-to-voltage converter 663 may include a resistor R663 and an amplifying circuit 6632. The resistor R663 is coupled between the return line RL3 and the power voltage terminal VDD, and generates a voltage difference V663 between two terminals of the resistor R663 in response to the detection current DRI3. The amplifying circuit 6632 is coupled to the two terminals of the resistor R663 to receive the voltage difference V663, and amplifies the voltage difference V663 to generate the detection voltage DRV3.

The operation of the keyboard apparatus 600 is similar to that of the keyboard apparatus 400 of FIG. 4. The only difference between the two is that: the detection circuit 460 of FIG. 4 can only detect the current of one of the return lines RL1~RL3 at one time (based on that the three return lines RL1-RL3 share the one current-to-voltage converter 464), but the detection circuit 660 of FIG. 6 can detect the current of each of the return lines RL1-RL3 simultaneously (based on that the currents of the return lines RL1-RL3 are respectively detected by the corresponding current-to-voltage converters 661-663). Thus, a key detection speed of the keyboard apparatus 600 of FIG. 6 is three times a key detection speed of the keyboard apparatus 400 of FIG. 4. The operation details related to the keyboard apparatus 600 of FIG. 6 may be inferred from the related descriptions of FIG. 4, FIG. 5A to FIG. 5C above, and thus are not repeated.

In summary, in the keyboard apparatus provided by the embodiments of the disclosure, the detection circuit can detect the current flowing through each of the return lines of the key module and correctly indicate that the switch of each the key of the key module is in an on state or in an off state according to the value of the detected current of each of the return lines. Hence, the ghost key phenomenon can be avoided. In addition, the detection circuit of the embodiments of the disclosure applies the current-to-voltage converter to detect the value of the current of each of the return lines, so as to determine whether each of the keys is pressed or not. Thus, in comparison to the general solutions to the ghost key phenomenon, such as increasing the size of the key matrix or separating each key with the diode, the detection circuit provided by the embodiments of the disclosure can effectively reduce the manufacturing cost of the keyboard apparatus.

Although the disclosure has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A keyboard apparatus, comprising:
    a key module, comprising a plurality of keys, a plurality of scan lines, and a plurality of return lines, wherein the scan lines and the return lines are crossed to each other and respectively coupled to the keys; and
    a detection circuit, comprising a current-to-voltage converter, wherein the current-to-voltage converter has a first terminal, a second terminal and a third terminal, the first terminal is coupled to a power voltage terminal and receives a detection current, the second terminal outputs a detection voltage, and the third terminal is coupled to the return lines and outputs the detection current to a selected retune line of the return lines.

2. The keyboard apparatus according to claim 1, wherein the detection circuit further comprises:
    a selection circuit, coupled to the return lines;
    wherein the selection circuit is controlled by a plurality of selection signals to conduct a current path between the current-to-voltage converter and the selected return line of the return lines,
    wherein the current-to-voltage converter converts the detection current into the detection voltage.

3. The keyboard apparatus according to claim 2, wherein the selection circuit comprises:
    a plurality of return switches, a first terminal of each of the return switches being coupled to one of the return lines, a second terminal of each of the return switches being coupled to the current-to-voltage converter, and a control terminal of each of the return switches receiving one of the selection signals.

4. The keyboard apparatus according to claim 3, wherein the current-to-voltage converter further comprises:
- a resistor, coupled between the second terminal of each of the return switches and the power voltage terminal, and generating a voltage difference between two terminals of the resistor in response to the detection current; and
- an amplifying circuit, coupled to the two terminals of the resistor to receive the voltage difference, and amplifying the voltage difference to generate the detection voltage.

5. The keyboard apparatus according to claim 1, wherein the keyboard apparatus further comprises:
- a processing circuit, coupled to the detection circuit to receive the detection voltage, and determining whether each of the keys is pressed according to the detection voltage.

\* \* \* \* \*